United States Patent
Duqi et al.

(10) Patent No.: US 10,768,408 B2
(45) Date of Patent: Sep. 8, 2020

(54) PROCESS FOR MANUFACTURING A MEMS MICROMIRROR DEVICE, AND ASSOCIATED DEVICE

(71) Applicant: STMicroelectronics S.r.l., Agrate Brianza (IT)

(72) Inventors: Enri Duqi, Milsno (IT); Lorenzo Baldo, Bareggio (IT); Roberto Carminati, Piancogno (IT); Flavio Francesco Villa, Milsno (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 431 days.

(21) Appl. No.: 15/465,019

(22) Filed: Mar. 21, 2017

(65) Prior Publication Data
US 2018/0031822 A1    Feb. 1, 2018

(30) Foreign Application Priority Data
Jul. 28, 2016 (IT) .......... 102016000079455

(51) Int. Cl.
| G02B 26/08 | (2006.01) |
| B81C 1/00 | (2006.01) |
| B81B 7/02 | (2006.01) |
| G02B 26/10 | (2006.01) |
| H04N 9/31 | (2006.01) |

(52) U.S. Cl.
CPC ............ *G02B 26/0833* (2013.01); *B81B 7/02* (2013.01); *B81C 1/00158* (2013.01); *B81C 1/00182* (2013.01); *G02B 26/0841* (2013.01); *G02B 26/101* (2013.01); *H04N 9/3191* (2013.01); *B81B 2201/042* (2013.01); *B81B 2203/0127* (2013.01); *B81B 2203/0315* (2013.01); *B81C 2201/0116* (2013.01); *B81C 2201/0177* (2013.01)

(58) Field of Classification Search
None
See application file for complete search history.

(56) References Cited

U.S. PATENT DOCUMENTS

| 5,719,073 A | 2/1998 | Shaw et al. |
| 6,342,430 B1 | 1/2002 | Adams et al. |

(Continued)

FOREIGN PATENT DOCUMENTS

CN    102190284 A    9/2011

OTHER PUBLICATIONS

IT Search Report and Written Opinion for IT 2016000079455 dated Apr. 21, 2017 (9 pages).

(Continued)

*Primary Examiner* — Nilufa Rahim
(74) *Attorney, Agent, or Firm* — Crowe & Dunlevy

(57) ABSTRACT

A buried cavity is formed in a monolithic body to delimit a suspended membrane. A peripheral insulating region defines a supporting frame in the suspended membrane. Trenches extending through the suspended membrane define a rotatable mobile mass carried by the supporting frame. The mobile mass forms an oscillating mass, supporting arms, spring portions, and mobile electrodes that are combfingered to fixed electrodes of the supporting frame. A reflecting region is formed on top of the oscillating mass.

27 Claims, 15 Drawing Sheets

(56) References Cited

U.S. PATENT DOCUMENTS

| | | | |
|---|---|---|---|
| 6,388,300 B1* | 5/2002 | Kano | B81B 3/0086 |
| | | | 257/417 |
| 6,563,106 B1* | 5/2003 | Bowers | B81B 3/004 |
| | | | 250/208.1 |
| 8,173,513 B2 | 5/2012 | Villa et al. | |
| 2003/0090172 A1 | 5/2003 | Lee et al. | |
| 2008/0224242 A1 | 9/2008 | Villa et al. | |
| 2013/0121509 A1* | 5/2013 | Hsu | H04R 19/013 |
| | | | 381/104 |
| 2013/0130502 A1 | 5/2013 | Sparks et al. | |
| 2014/0198366 A1 | 7/2014 | Carminati et al. | |
| 2014/0319630 A1* | 10/2014 | Conti | H04R 19/005 |
| | | | 257/416 |
| 2015/0168715 A1 | 6/2015 | Vigna et al. | |

OTHER PUBLICATIONS

First Office Action and Search Report for co-pending CN Appl No. 201710191543.X dated Jan. 11, 2019 (10 pages).

* cited by examiner

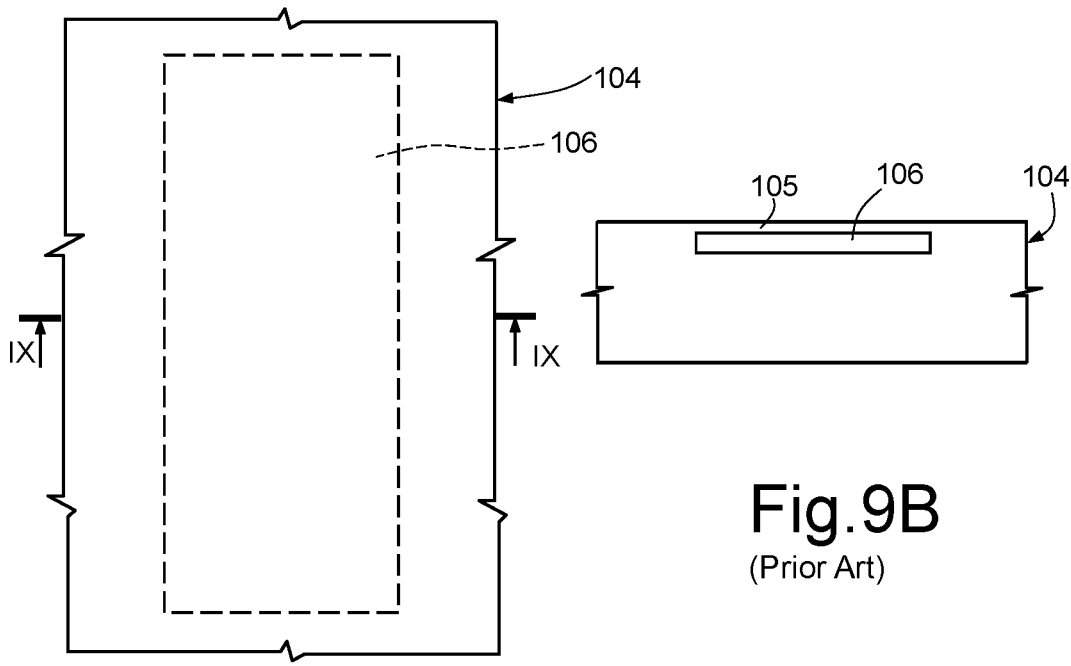
Fig.9A
(Prior Art)
Fig.9B
(Prior Art)
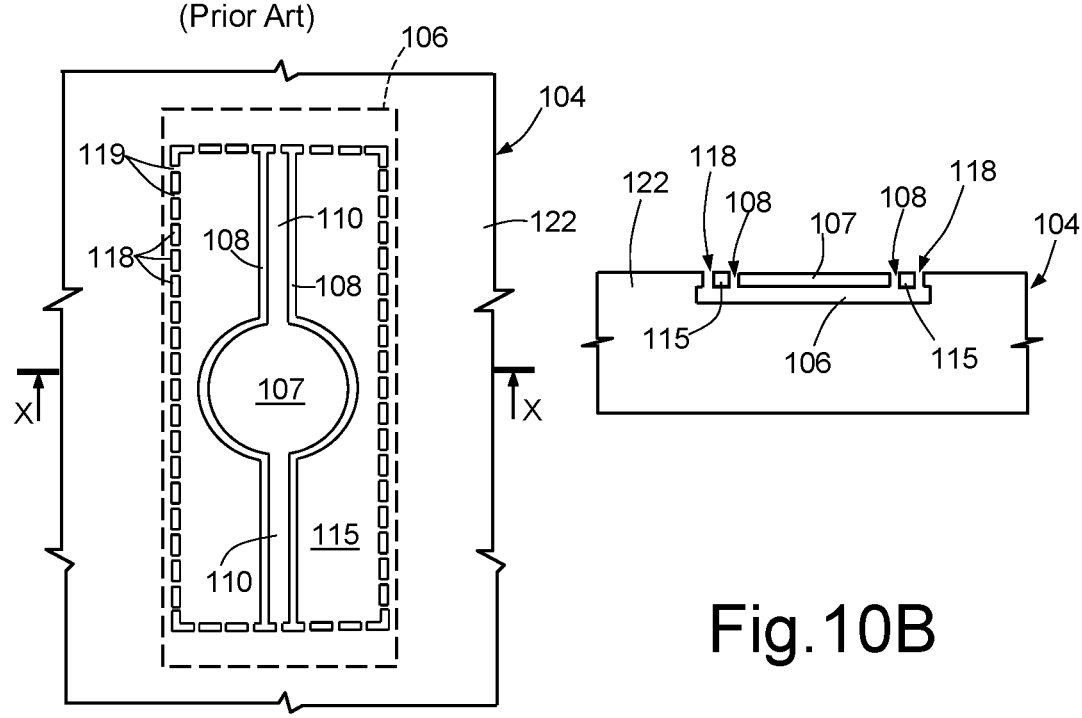
Fig.10A
Fig.10B

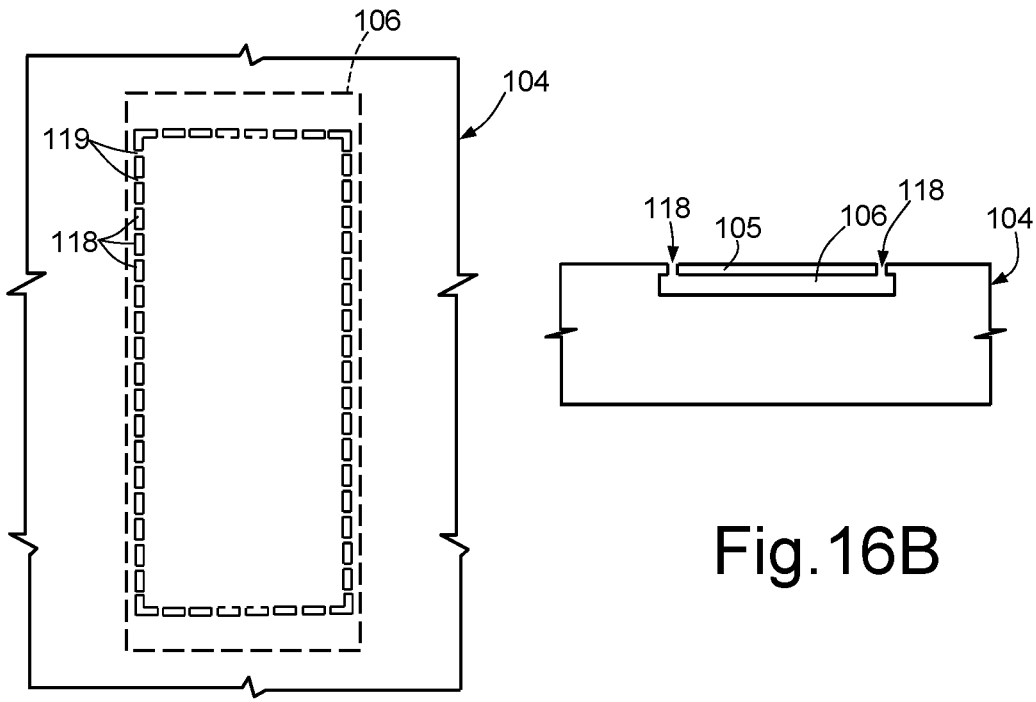
Fig.16A
Fig.16B
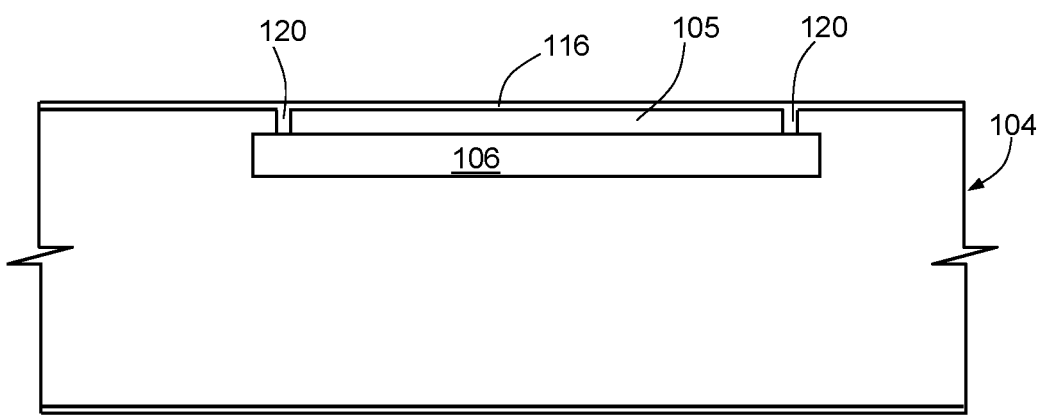
Fig.17

PROCESS FOR MANUFACTURING A MEMS MICROMIRROR DEVICE, AND ASSOCIATED DEVICE

PRIORITY CLAIM

This application claims the priority benefit of Italian Application for Patent No. 102016000079455, filed on Jul. 28, 2016, the disclosure of which is hereby incorporated by reference in its entirety.

TECHNICAL FIELD

The present invention relates to a process for manufacturing a MEMS micromirror device and to an associated device.

BACKGROUND

Hereinafter, in the present description, the term "buried cavity" will be used with reference to an empty area (or filled with gas) within a semiconductor body or chip, spaced apart from the two main faces of the body by portions of semiconductor material.

Micromirror devices manufactured using the semiconductor material technology are known and also referred to as MEMS (Micro-Electro-Mechanical System) devices.

These MEMS micromirror devices are, for example, used in portable apparatuses, such as portable computers, laptops, notebooks (including ultra-thin notebooks), PDAs, tablets, and smartphones, for optical applications, for directing, with desired modalities, beams of light radiation generated by a light source.

By virtue of their small size, these MEMS micromirror devices meet stringent requirements regarding bulk, in terms of area and thickness.

For instance, MEMS micromirror devices are used in miniaturized projector modules (so-called picoprojectors), which are able to project images at a distance or to generate desired patterns of lights.

MEMS micromirror devices generally include a mirror element that is mobile, typically with inclination or rotation movements, and is able to direct an incident light beam in a desired way.

For instance, FIG. 1 is a schematic illustration of a picoprojector 9 comprising a light source 1, typically a laser source generating a light beam 2 of three monochromatic beams, one for each basic colour that, through an optical system 3 illustrated only schematically, is deflected by a mirror element 5 towards a screen 6. In the shown example, the mirror element 5 is of a two-dimensional type, controlled so as to turn about a vertical axis A and a horizontal axis B. Rotation of the mirror element 5 about the vertical axis A generates a fast horizontal scan. Rotation of the mirror element 5 about the horizontal axis B, perpendicular to the vertical axis A, generates a slow vertical scan, typically of a sawtooth type.

The obtained scanning scheme is illustrated in FIG. 2 and designated by 7.

In a variant to the system of FIG. 1, the system comprises two micromirrors arranged in sequence along the path of the light beam 2 and each rotatable about an own axis; namely, one is rotatable about the horizontal axis B and the other about the vertical axis A, for generating the same scanning scheme of FIG. 2.

Another application of micromirror systems are 3D gesture-recognition systems. These normally use a picoprojector and an image-acquisition device, such as a camera. The light beam here may be in the visible range, in the invisible range or at any useful frequency. The picoprojector may be similar to the picoprojector 9 of FIG. 1, and the light beam 2 deflected by the micromirror 5 is used for scanning an object in two directions. For instance, the picoprojector may project small stripes on the object; possible projecting or recessed areas of the object (due to the depth thereof) create deformations in the light rays detected by the camera, and these deformations may be detected and used by a suitable electronics connected to the camera in order to detect the third dimension.

In either case, rotation of the mirror element is generally controlled via an actuation system, currently of an electrostatic, magnetic, or piezoelectric type.

For instance, FIGS. 3-5 show a micromechanical mirror structure 10 with purely electrostatic actuation, forming the subject of United States Application for Patent No. 2014/0198366 (incorporated by reference).

The micromechanical mirror structure 10 comprises a first body 11 and a second body 14, for example both of semiconductor material such as silicon, bonded together via a bonding layer (not illustrated), as explained hereinafter.

The first body 11 forms a mobile mass 12 surrounded by a trench 13 and suspended over a cavity, or opening, 15 formed in the second body 14 and having a height (along axis y of a cartesian reference system) smaller than the thickness of the second body 14.

The mobile mass 12 has a central portion 12A, for example, circular in plan view (in the horizontal plane XY), supporting a mirror layer 16. The mirror layer 16 is formed by a material having high reflectivity for the light radiation to be projected, such as aluminium or gold. The mobile mass 12 moreover has supporting portions 12B having an elongated shape and extending on opposite sides with respect to the central portion 12A along axis x of a horizontal plane XY.

The central portion 12A is coupled, at the supporting portions 12B, to anchorages 18, fixed with respect to the second body 14, through elastic elements (springs) 19, of a torsional type, which enable rotation thereof out of the horizontal plane XY.

The elastic elements 19 have a longitudinal extension along axis x and define, along their extension direction, a rotation axis C for the mobile mass 12.

Moreover, the supporting portions 12B of the mobile mass 12 carry, rigid therewith, finger-shaped mobile electrodes 22, which extend in the plane XY on opposite sides of the supporting portions 12B along axis y and within the trench 13.

The micromechanical mirror structure 10 further comprises a fixed portion 23, in the first body 11 and rigid with respect to the second body 14, separated from the mobile mass 12 by the trench 13. The fixed portion 23 carries fixed electrodes 24, also having a finger conformation, facing and combfingered (interdigitated) with the mobile electrodes 22.

First contact pads 25A and second contact pads 25B are carried by respective top surfaces of the fixed portion 23 and of the anchorages 18, for electrical biasing, respectively, of the fixed electrodes 24 and of the mobile electrodes 22.

In use, application of an appropriate potential difference between the mobile electrodes 22 and the fixed electrodes 24 causes torsion of the elastic elements 19 and rotation of the central portion 12A of the mobile mass 12 (and of the associated mirror layer 16) about rotation axis C, according to the desired movement for reflecting an incident light beam towards the outside of the micromechanical mirror structure 10.

The micromechanical mirror structure 10 is currently manufactured as shown in FIGS. 6 and 7 starting from a SOI (Silicon-On-Insulator) substrate.

In detail, FIG. 6, the process comprises bonding a SOI wafer 30 to the second body 14. The SOI substrate 30, in a known way, comprises a first silicon layer 31, an insulating layer 32, and a second silicon layer 33. The first silicon layer 32 operates as handling layer and is thus thick, for example it is 400 µm thick, and the second silicon layer 34, in which the mobile mass 12 of FIG. 3 is formed, has a smaller thickness, for example, 50 µm.

The second body 14 is generally machined before bonding it to the SOI substrate 30. In detail, and in a known manner, for example via deep dry etching, the cavity 15 of FIG. 3 is formed. Furthermore, inside and on top of the second body 14, contact and electrical connection regions (not illustrated) are formed.

The SOI wafer 30 is bonded to the second body 14 through an adhesive layer 36, for example of silicon oxide, glass frit, or other bonding material normally used in MEMS devices. At least part of the adhesive layer 36 may be of a conductive type to enable electrical connection and biasing of the regions formed in the first body 11 of FIG. 3.

Next, FIG. 7, the SOI wafer 30 is thinned, for example via CMP (Chemical Mechanical Polishing) so as to remove the first silicon layer 31 and the insulating layer 32, thus forming the first body 11. Then, for example through selective etching, the second silicon layer 33 is defined to form the mobile mass 12, including the central portion 12A, the supporting portions 12B, and the mobile electrodes 22, as well as the fixed electrodes 23 of FIG. 3 (not visible in FIG. 7).

The mirror layer 16 and the second contact pads 25B are then made on the exposed surface of the second silicon layer 33.

With this solution, the second silicon layer 33 of the SOI wafer 30 has the planarity level desired for forming a micromirror structure, since it is of monocrystalline silicon and thus has high planarity (low roughness) and is thus well suited as a base for the mirror layer 16.

The described process has yielded good results but is relatively costly due to the presence of the SOI wafer which makes difficult to reduce the costs of the micromechanical mirror structure 10 and thus its use in low-cost devices and apparatuses.

There is a need in the art to provide a micromirror device that overcomes the drawbacks of the prior art and in particular may be manufactured at lower costs than the currently.

SUMMARY

In an embodiment, a process for manufacturing a micromirror device in MEMS technology comprises the steps of: forming a buried cavity in a monolithic body of semiconductor material having a first and a second main surfaces, the buried cavity delimiting at the bottom a suspended membrane arranged between the buried cavity and the first main surface; defining the suspended membrane to form a supporting frame and a mobile mass carried by the supporting frame and rotatable about an axis parallel to the first main surface; and forming a reflecting region on top of the mobile mass.

In an embodiment, a MEMS micromirror device comprises: a monolithic body of semiconductor material having a first and a second main surface, wherein the monolithic body has an opening extending from the second main surface and comprises a suspended membrane of monocrystalline semiconductor material extending between the opening and the first main surface of the monolithic body, wherein the suspended membrane comprises a supporting frame and a mobile mass carried by the frame and rotatable about an axis parallel to the first main surface; and a reflecting region extends over the mobile mass

BRIEF DESCRIPTION OF THE DRAWINGS

For a better understanding of the present invention, preferred embodiments thereof are now described, purely by way of non-limiting example, with reference to the attached drawings, wherein:

FIGS. 9A and 9B are a top plan view and a cross-section, respectively, of the wafer of FIG. 8, in a subsequent manufacturing step;

FIGS. 10A and 10B are a top plan view and a cross-section, respectively, similar to FIGS. 9A and 9B, in a further manufacturing step of the micromirror device;

FIGS. 16A and 16B are a top plan view and a cross-section, respectively, of a variant of the manufacturing process;

FIGS. 17-19 are cross-sections similar to FIG. 16B, at an enlarged scale, in subsequent manufacturing steps of the micromirror device, according to the variant of the manufacturing process;

DETAILED DESCRIPTION

It should be noted that, in the figures described hereinafter, in the top plan views only half of the structure is sometimes represented, due to its symmetry.

Hereinafter, the present manufacturing process will be described with reference to manufacture of a single micromirror device, it being understood that it is replicated a number times in a wafer, before dicing of the wafer, in a per se known manner for the person skilled in the art.

Figure 8:
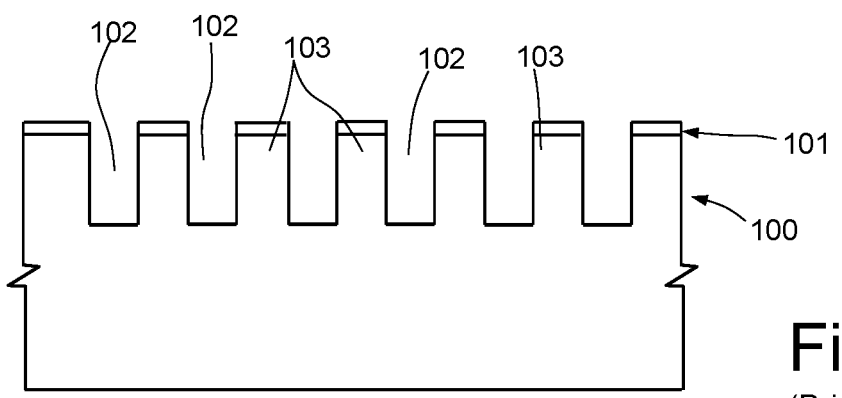
FIG. 8 is a cross-section through a semiconductor material wafer in an initial manufacturing step of a micromirror device.

Initially, FIG. 8, a buried cavity is formed in a wafer of monocrystalline semiconductor material such as silicon. For instance, to this end, the manufacturing process described in U.S. Pat. No. 8,173,513) and summarized briefly hereinafter may be used.

In detail, a resist mask 101 having openings forming a honeycomb lattice is formed on an initial wafer 100. Using mask 101, an anisotropic etch is carried out on the initial wafer 100 so as to form a plurality of trenches 102 communicating with each other and delimiting a plurality of silicon columns 103.

Next, after removing mask 101, an epitaxial growth is carried out in a reducing environment. Consequently, an epitaxial layer, for example, of an N type, grows on top of the columns 103, closing the trenches 102 at the top, thus forming a wafer 104.

A thermal annealing is then carried out, for example, for 30 minutes to 1190° C., preferably in hydrogen atmosphere, or, alternatively, in nitrogen atmosphere. As discussed in the aforementioned patents, annealing causes migration of the silicon atoms, which tend to move into a lower-energy position. Consequently, and also by virtue of the short distance between the columns 103, the silicon atoms of the latter migrate completely, and a buried cavity 106 is formed, as illustrated in the cross-section of FIG. 9B and, with a line dashed, in FIG. 9A. A thin silicon layer remains on the buried cavity 106, for example, of a thickness of 50 μm, formed in part by epitaxially grown silicon atoms and in part by migrated silicon atoms. This layer thus forms a membrane 105 of monocrystalline silicon, suspended over the buried cavity 106.

Figure 10C:
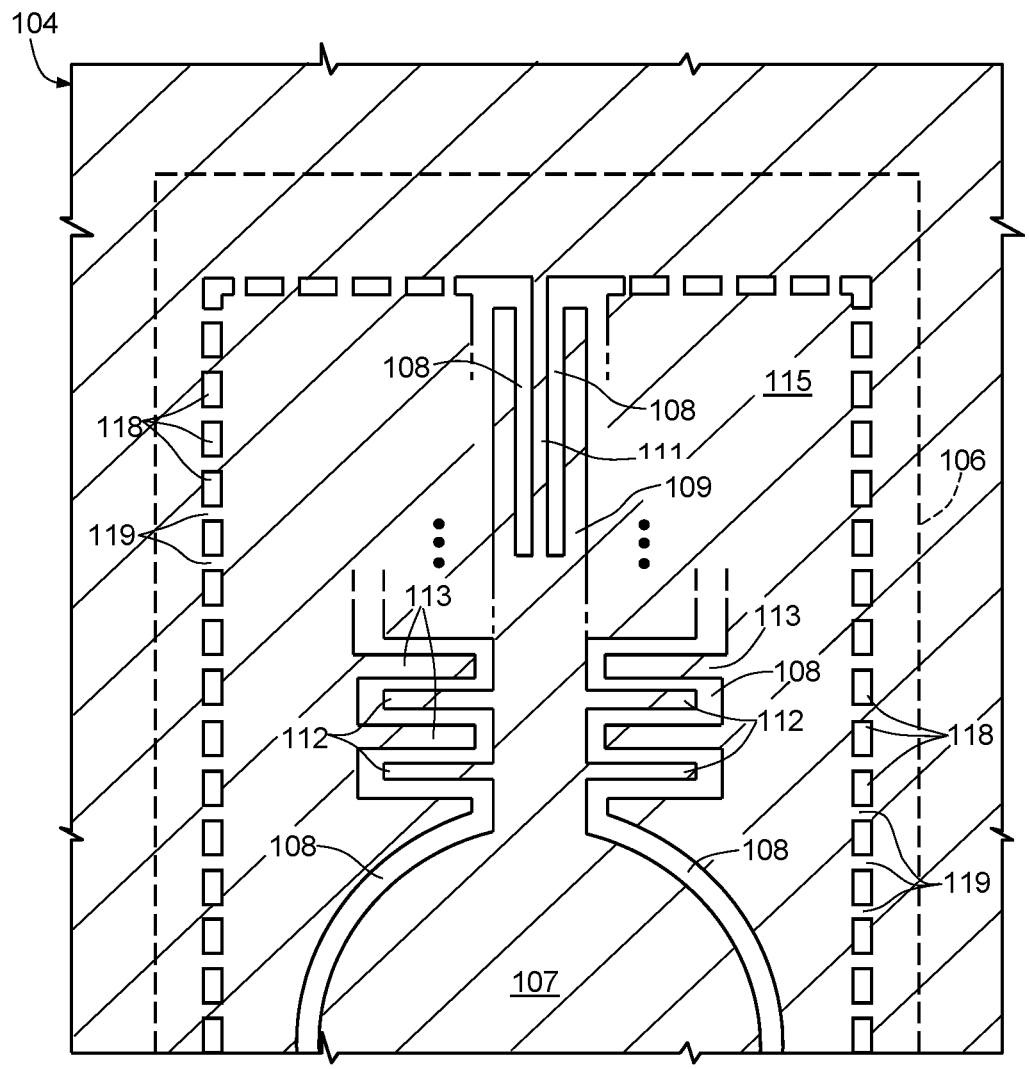
FIG. 10C shows a portion of FIG. 10A, at an enlarged scale.

Next, FIGS. 10A-10C, the membrane 105 is etched to define the micromirror structure by forming trenches 108 that surround an oscillating mass 107, supporting arms 109, spring portions 111 (visible in the enlarged detail of FIG. 10C), and mobile and fixed electrodes 112, 113 (also visible in the enlarged detail of FIG. 10C). The oscillating mass 107, the supporting arms 109, the spring portions 111, and the mobile electrodes 112 form a mobile mass 114. The trenches 108 extend through the membrane 105, as far as the buried cavity 106, separating the mobile mass 114 from a supporting frame 115 suspended over the cavity 106 and carrying the fixed electrodes 113. The trenches 108 have a size and an aspect ratio such as not to be filled in the subsequent oxidation step, as discussed hereinafter in detail with reference to FIGS. 11A and 11B.

During etching of the trenches 108, a plurality of holes 118 is also formed, which extend through the membrane 105 as far as the cavity 106, like the trenches 108. As visible in the top plan views of FIGS. 10A, 10C, the holes 118 are aligned with each other along a closed line, here rectangular, and extend in proximity of the periphery of the membrane 105. In this way, between adjacent pairs of holes 118, suspension bridges 119 are formed, connect the membrane 105 to the supporting frame 115 and suspended it over the cavity 106, during and after the etching step.

As an alternative to what illustrated, the holes 118 may be arranged along a line that is not closed, but is sufficient to surround and separate the supporting frame 115, suspended over the cavity 106, from the rest of the substrate (supporting portion 122 of the wafer 104).

Figure 11A:
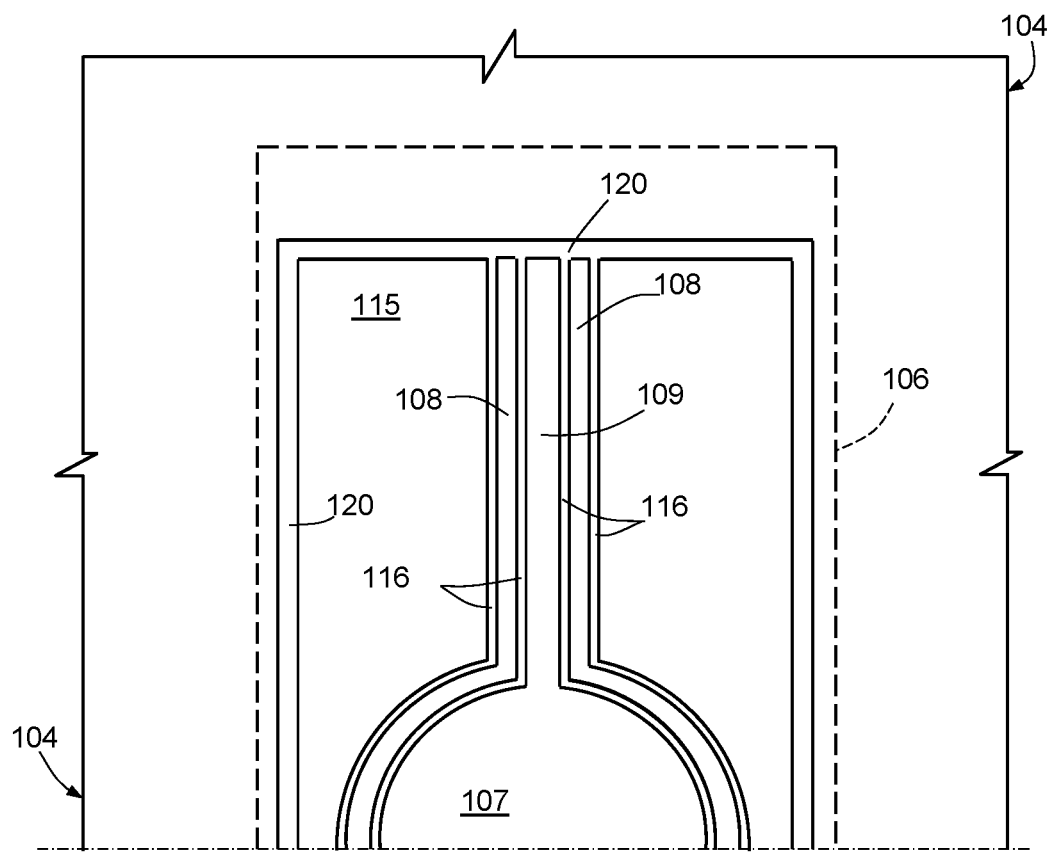
FIGS. 11A and 11B are, respectively, a top plan view of a structure half and a cross-section similar to FIGS. 10A and 10B, at an enlarged scale, in a subsequent manufacturing step of the micromirror device.
Figure 11B:
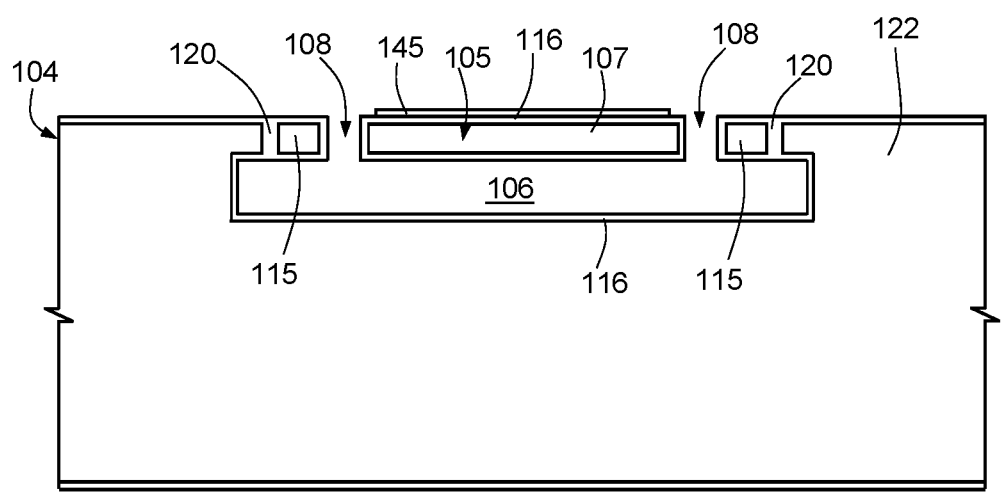

The holes 118 have an aspect ratio and dimensions such as to be completely closed in a subsequent oxidation step, as explained hereinafter, and are at a distance such as to cause complete oxidation of the suspension bridges 119 in the subsequent oxidation (FIGS. 11A and 11B). For instance, the holes 118 may have a rectangular or square area at a maximum distance of approximately 0.5 μm and have a minimum dimension (for example, a width in the direction perpendicular to the closed line) of approximately 0.4-0.45 μm. In any case, the dimensions of the holes 110 are not critical, as discussed hereinafter.

Then, FIGS. 11A and 11B, the suspension bridges 119 are oxidized, thereby causing the holes 118 to be closed, an oxide layer 116 to be formed on the exposed walls of the membrane 105 (and thus of the oscillating mass 107, the spring portions 111, the mobile electrodes 112, the fixed electrodes 113, and the buried cavity 106), and the suspension bridges 119 to be completely oxidized. An insulation region, designated at 120, is thus formed, and completely surrounds the membrane 105, electrically insulating it from the rest of the wafer, as may be noted in particular from FIG. 11A, where the spring portion 111 and the mobile and fixed electrodes 112, 113 are not represented for sake of illustration clarity.

It should be noted that, in this step, the trenches 108 are not filled with oxide, since their width (as indicated above, e.g., 5 μm) is much greater than that of the holes 118 (e.g., 0.45 μm).

Then, a metal layer is deposed and defined (via a resist layer deposited by means of a roller) for forming a reflecting region 145 over the oscillating mass 107, contact pads, and for opening the contacts, in a per se known and not illustrated manner.

Figure 12:
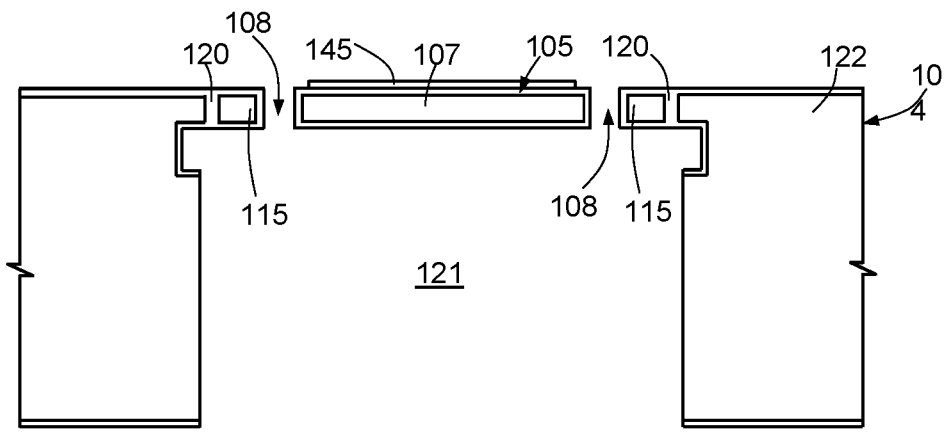
FIGS. 12-14 are cross-sections similar to FIG. 11B, in subsequent manufacturing steps of the micromirror device.

Next, FIG. 12, the wafer 104 is etched from the back, using a dry etching, at the cavity 106. In this step, the oxide layer 116 operates as an etch stop. In this way, underneath the membrane 105 a very wide opening 121 is formed, corresponding to the silicon removed during dry etching and to the cavity 106, so that beneath the oscillating mass 107 no regions are present that may interfere with the movement of rotation of the oscillating mass 107.

Figure 13:
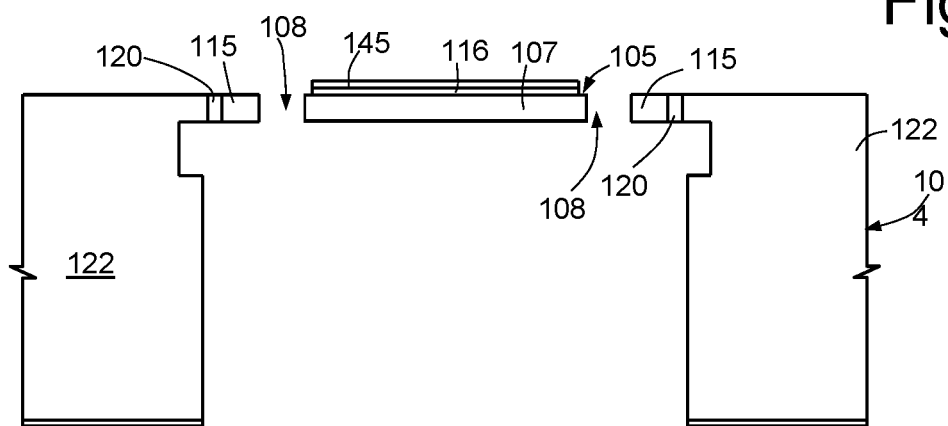
Figure 14:
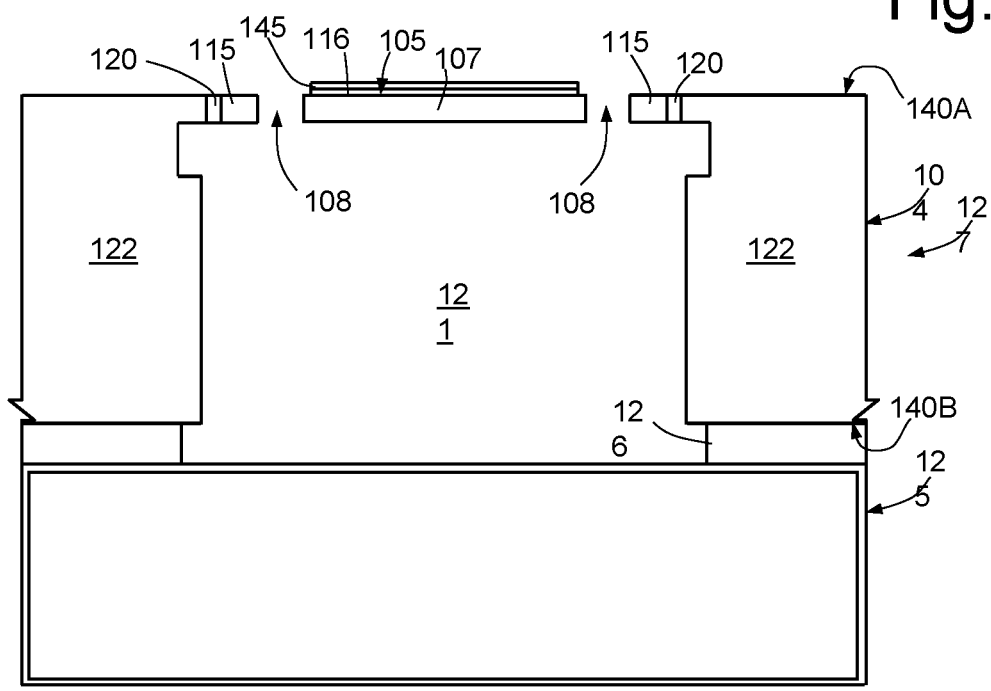

Next (FIG. 13), the oxide layer 116 is removed by wet etching and, if envisaged, FIG. 14, the wafer 104 may be bonded to a handling wafer 125 through a bonding layer 126, for example of silicon oxide, glass frit, or some other bonding material normally used in MEMS technology, in case comprising conductive portions. A composite wafer 127 is thus obtained.

Figure 15:
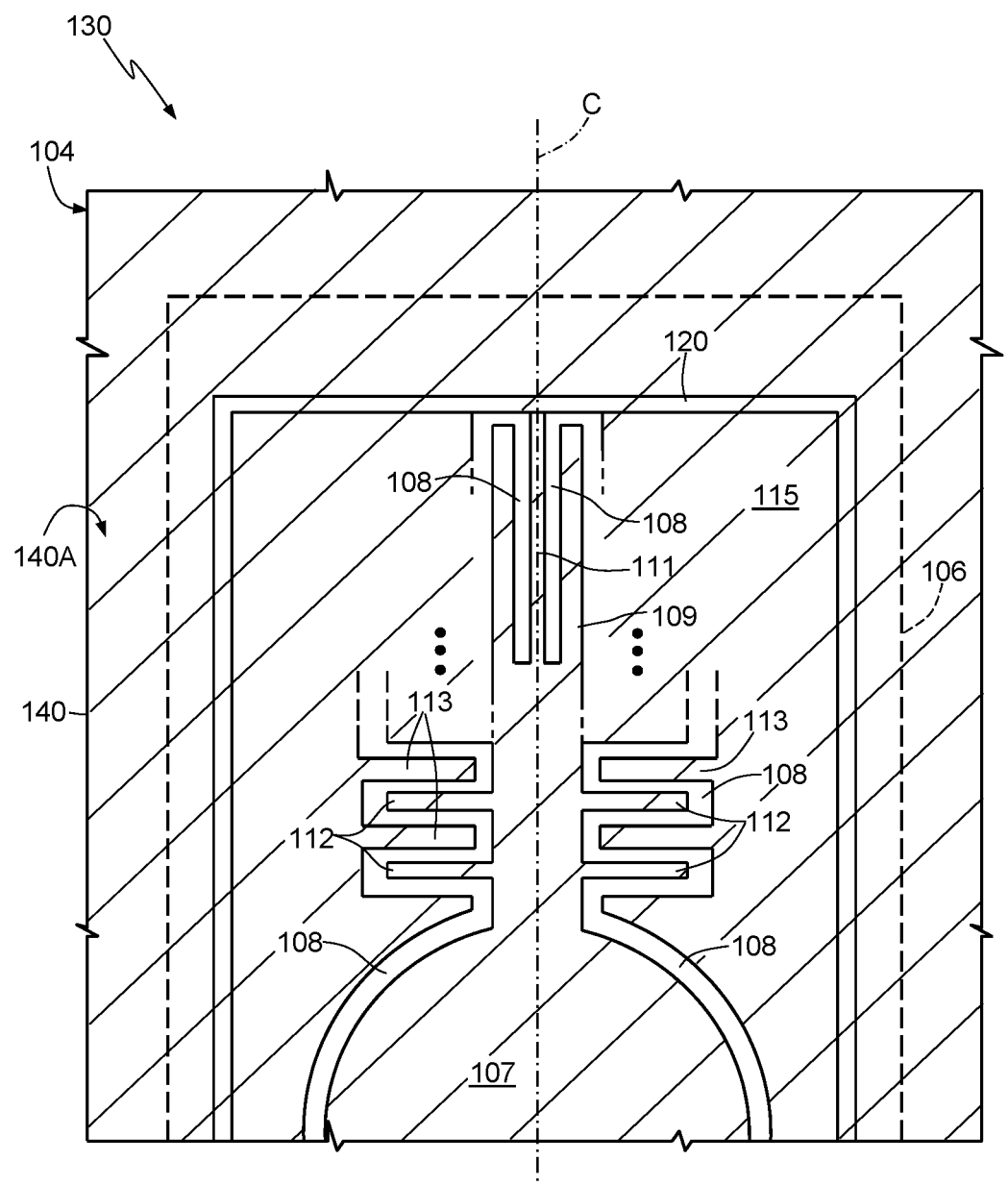
FIG. 15 shows a top plan view of half of the micromirror device.

After dicing, a micromirror device 130, as illustrated in FIG. 15, is thus obtained.

The finished micromirror device 130 thus comprises a monolithic body 140 of semiconductor material delimited at the top and at the bottom by a first a second main surface 140A, 140B (FIG. 14), here planar. The monolithic body 140 has the fixed supporting portion 122 and has the opening 121 extending from the second main surface 140B and delimiting at the bottom the suspended membrane 105. The suspended membrane 105, of monocrystalline semiconductor material, is thus arranged between the opening 121 and the first main surface 140A. The suspended membrane 105 forms the supporting frame 115 and the oscillating mass 107. The oscillating mass 107 is carried by the supporting frame 115 and is rotatable about an axis C parallel to the first main surface 140A. The reflecting region 145 extends over the oscillating mass 107.

FIGS. 16A, 16B, and 17-19 show subsequent manufacturing steps of a different embodiment, where holes 118 used to form the insulation region 120 are made in a separate step with respect to the trenches 108.

In detail, according to this variant, initially the same process steps are carried out as described above with reference to FIGS. 8 and 9A-9B, forming the wafer 104 having the buried cavity 106 under the membrane 105.

Next, FIGS. 16A-16B, the membrane 105 is etched to form the plurality of holes 118. Also here, the holes 118 extend through the membrane 105 as far as the cavity 106 and are aligned with each other along a line, also here closed, in proximity of a boundary of the membrane 105. Also here, suspension bridges 119 between adjacent pairs of holes 118 connect the membrane 105 to the supporting frame 115 and keep it suspended over the cavity 106.

The holes 118 have dimensions and aspect ratio similar to the those discussed above with reference to FIGS. 10A-10C.

Then (FIG. 17), the suspension bridges 119 are thermally oxidised, as described above with reference to FIGS. 10A-10C. Thereby, the insulating region 120 is formed. In this step, oxidation of the walls of the buried cavity 106 may also occur, in a not shown manner.

Figure 18:
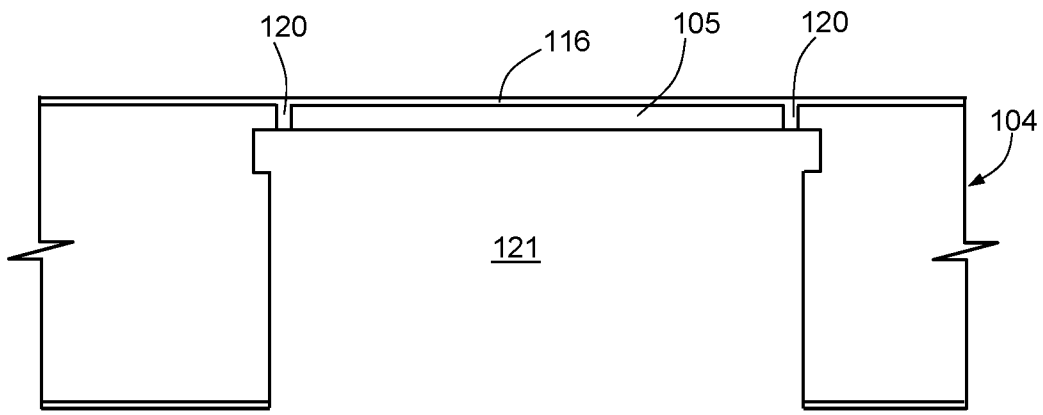

After depositing and defining a metal layer, to form electrical-connection regions and the reflecting region 145, opening the contacts, and depositing and defining the contact pads, the wafer 104 is etched from the back to form the opening 121 (FIG. 18).

Figure 19:
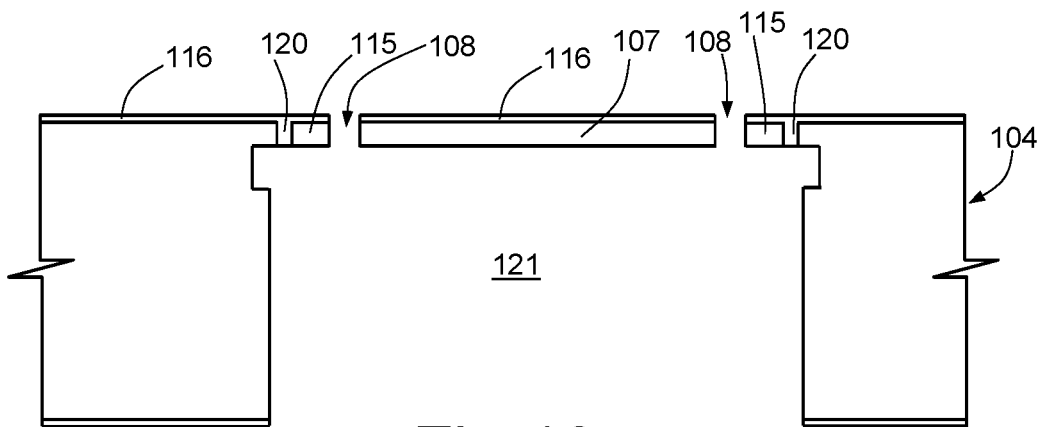

Next, FIG. 19, the membrane 105 is etched to form the trenches 108. Thus, the oscillating mass 107, the supporting frame 115, the supporting arms 109, the spring portions 111, and the mobile and fixed electrodes 112, 113 are defined, the supporting arms 109, the spring portions 111, and the mobile and fixed electrodes 112, 113 are being visible in the cross-section of FIG. 19, but being similar to the homologous elements of FIG. 10C.

Then, the final steps described above follow, including removing the oxide layer 116, possible bonding to a handling wafer 125, and dicing, to obtain the micromirror device 130 of FIG. 15.

Figure 20B:
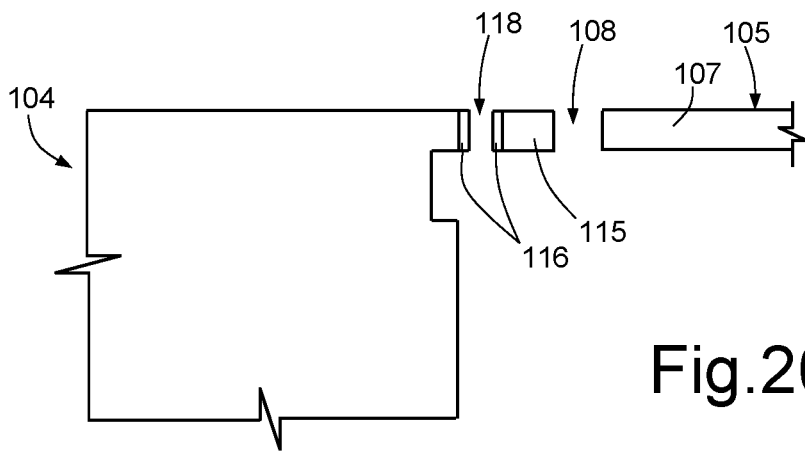
FIGS. 20A and 20B show an enlarged detail of a variant of the micromirror device, in top plan view and in cross-section.
Figure 20A:
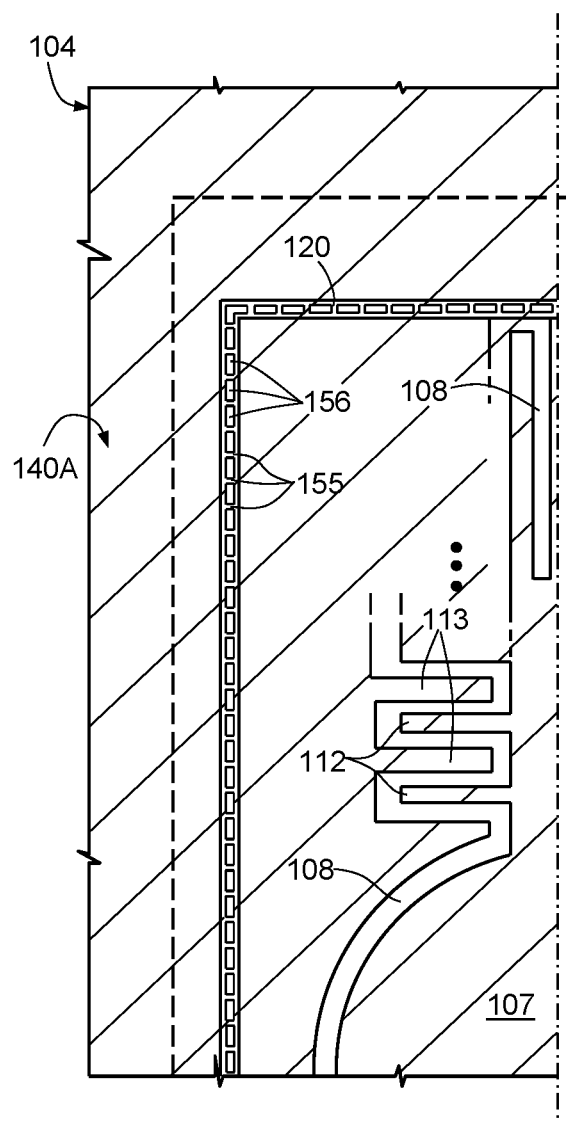

In a different embodiment, as illustrated in the enlarged details of FIGS. 20A and 20B, the holes 118 do not oxidize completely during the oxidation steps of FIG. 11A, 11B, or 17 and thus the insulation region 120 is formed by oxide portions 155 surrounding holes or air gaps 156. In this case, also after removing the oxide layer 116 (as in the embodiment of FIGS. 8-15), insulation is nonetheless ensured by the oxide portions formed from the suspension bridges 119.

The process described herein enables manufacturing the micromirror device 130 in a relatively low-cost way, since use of a SOI substrate is no longer necessary. On the other hand, forming the suspended mass from a membrane suspended over a cavity formed by epitaxial growth of monolithic semiconductor material provides a high planarity and low surface roughness of the suspended mass 107. In this way, a mirror device having a high-quality reflecting surface may be obtained.

The micromirror device 130 may be used in a picoprojector 201 designed to be functionally coupled to a portable electronic apparatus 200, as described hereinafter with reference to FIGS. 21-22.

Figure 1:
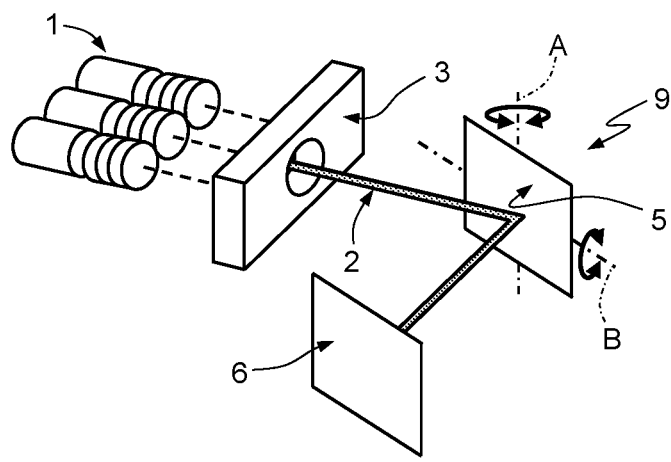
FIG. 1 is a schematic representation of a picoprojector.
Figure 2:
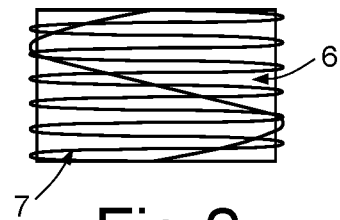
FIG. 2 shows the projection scheme of an image generated by the picoprojector of FIG. 1 on a screen.
Figure 21:
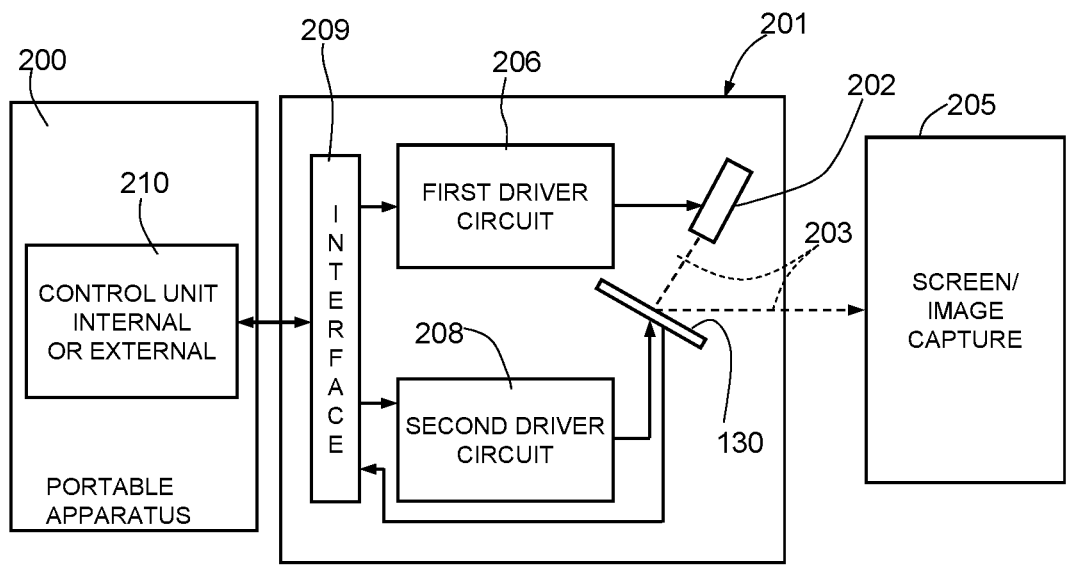
FIG. 21 is a block diagram of a picoprojector using the micromirror device.
Figure 3:
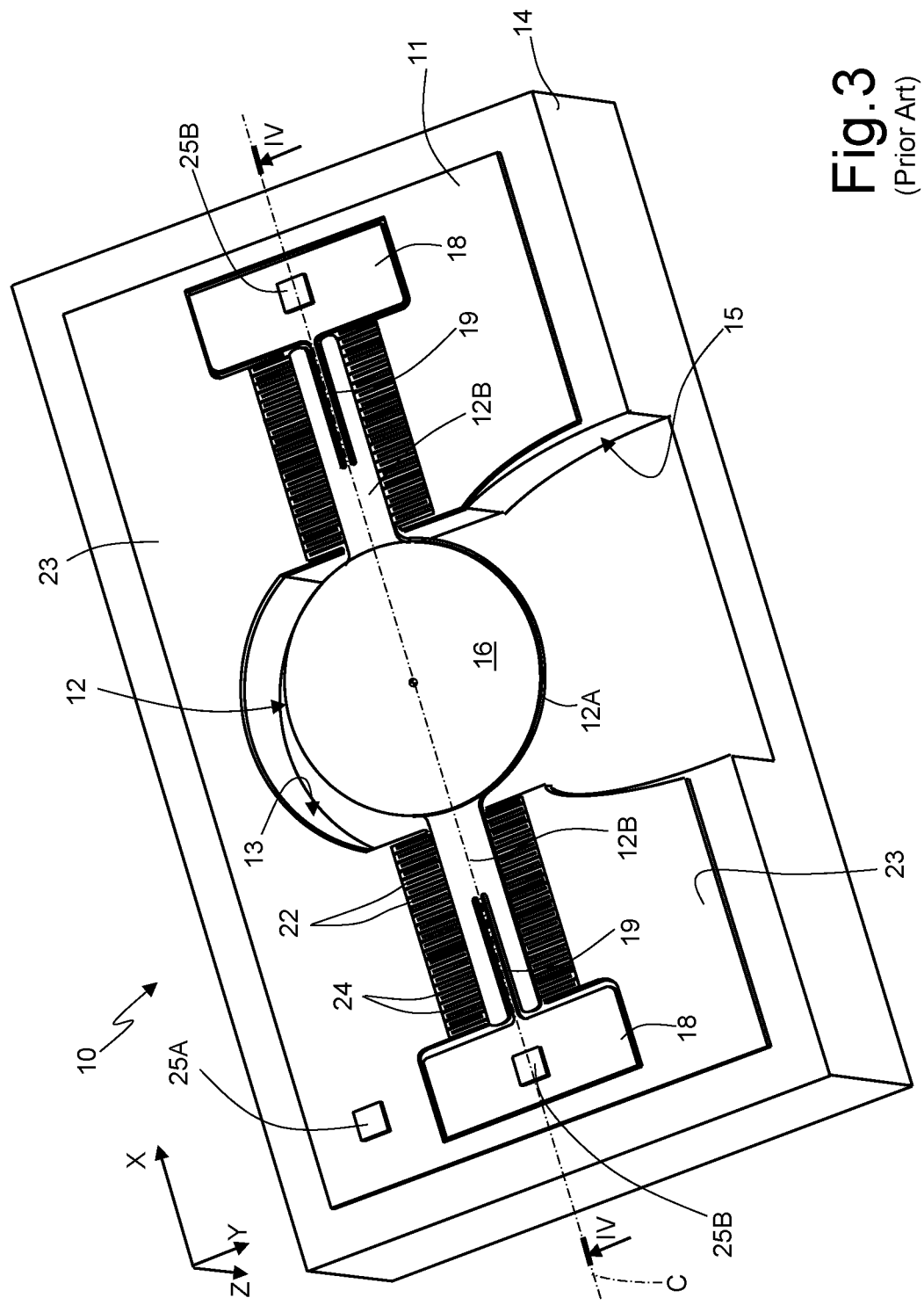
FIG. 3 is a perspective view of the present micromirror device.
Figure 4:
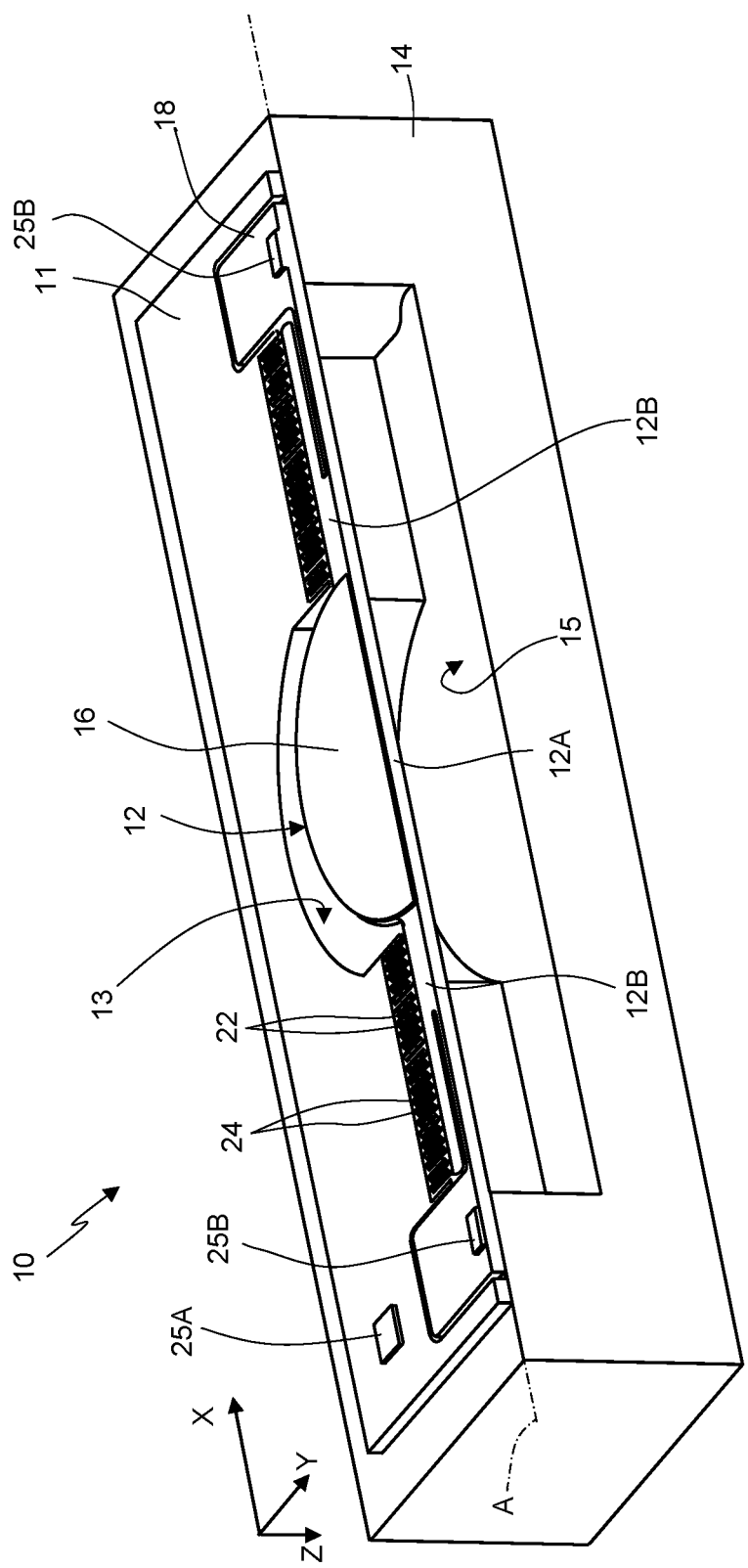
FIGS. 4 and 5 are cross-sections of the micromirror device of FIG. 3, taken along respective section lines IV-IV and V-V of FIG. 3.
Figure 5:
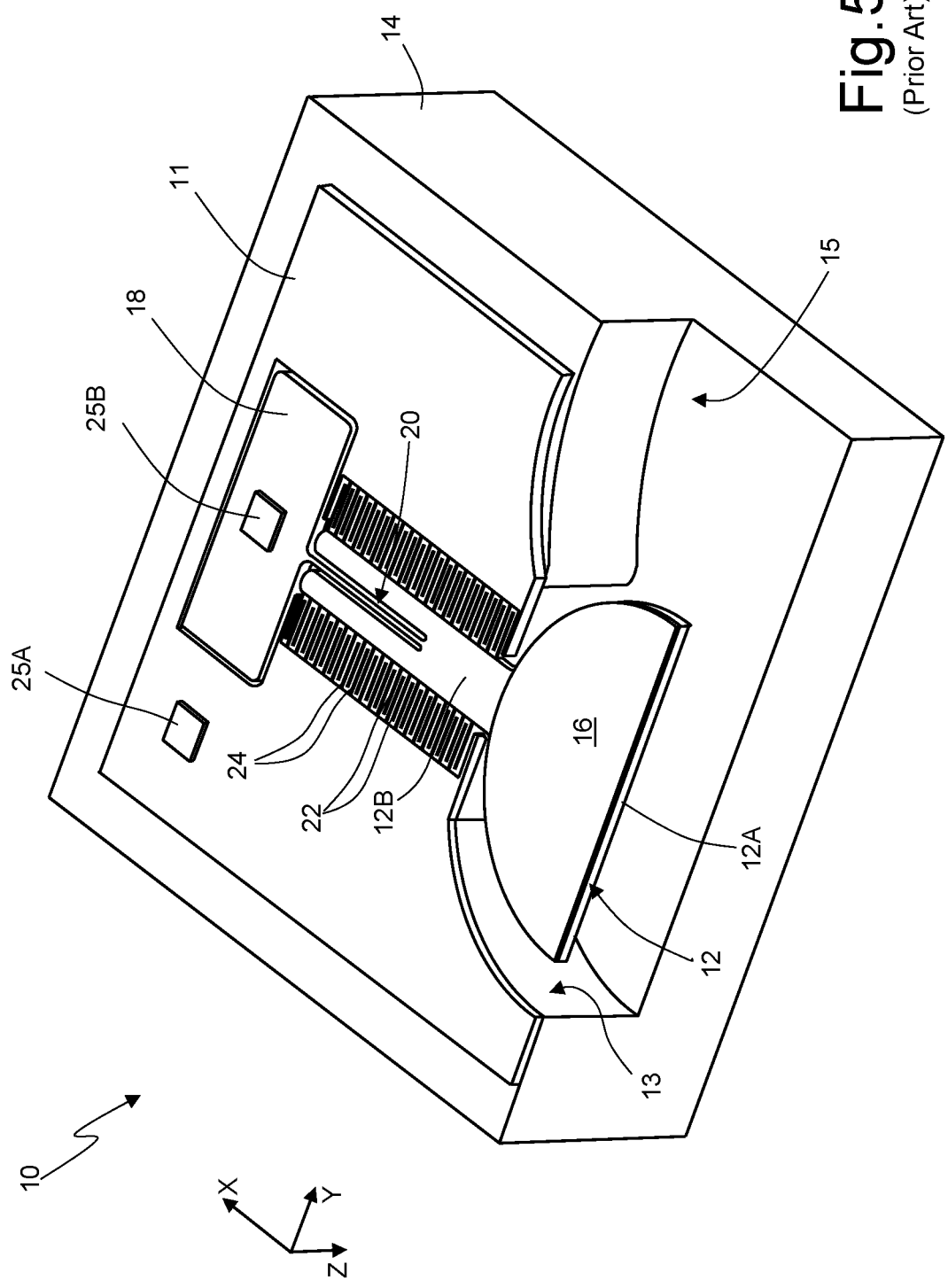
Figure 6:
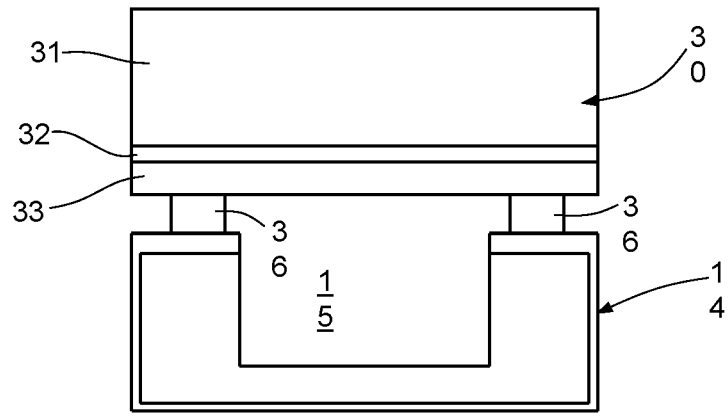
FIGS. 6 and 7 are cross-sections through intermediate structures of the micromirror device of FIG. 3, in two subsequent manufacturing steps.
Figure 7:
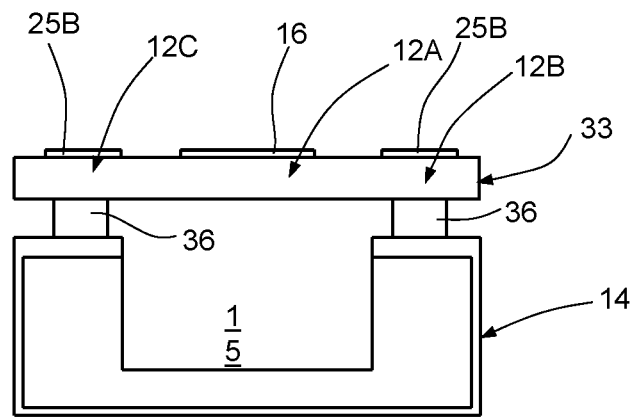

In detail, the picoprojector 201 of FIG. 21 comprises a light source 202, for example, of a laser type, configured to generate a light beam 203; the micromirror device 130, configured to receive the light beam 203 and to direct it towards a screen or an image-capture module 205 (external and arranged at a distance from the picoprojector 201); a first driver circuit 206, configured to supply appropriate control signals to the light source 202, for generating the light beam 203 as a function of an image to be projected; a second driver circuit 208, configured to supply rotation driving signals for the oscillating mass 107 (FIG. 15) of the micromirror device 130; and a communication interface 209, configured to receive, from an internal or external control unit 210, for example, included in the portable apparatus 200, light information on the image to be generated, for example in the form of a pixel array. The light information is inputted to drive the light source 202.

Furthermore, the control unit 210 may comprise a unit for controlling the angular position of the mirror of the micromirror device 130. To this end, the control unit 210 may receive the signals generated by photodetectors (not represented in FIG. 21) through the interface 209 and accordingly control the second driver circuit 208.

Figure 22:
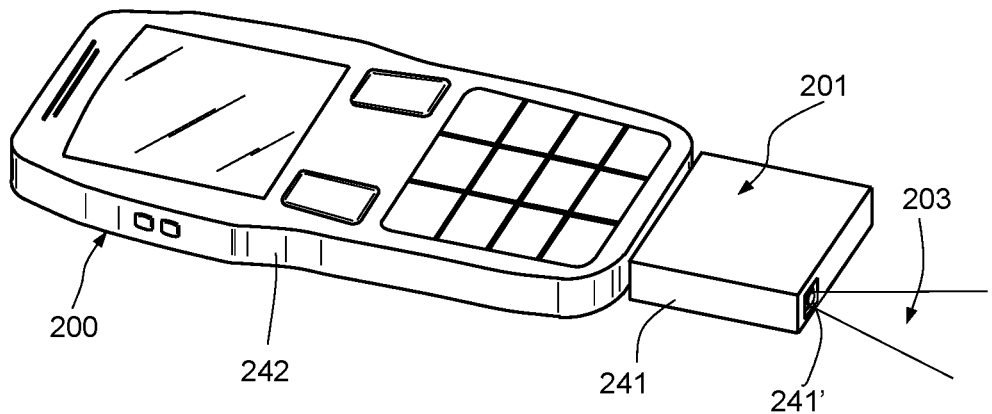
FIGS. 22 and 23 show different couplings between the picoprojector of FIG. 21 and a portable electronic apparatus.

The picoprojector 201 may be provided as separate and stand-alone accessory with respect to an associated portable electronic apparatus 200, for example, a cellphone or smartphone, as illustrated in FIG. 22. In this case, the picoprojector 201 is coupled to the portable electronic apparatus 200 through appropriate electrical and mechanical connection elements (not illustrated in detail). Here, the picoprojector 201 is provided with an own casing 241, having at least one portion 241' transparent to the light beam 203 coming from the micromirror device 130. The casing 241 of the picoprojector 201 is removably fitted into a respective casing 242 of the portable electronic apparatus 200.

Figure 23:
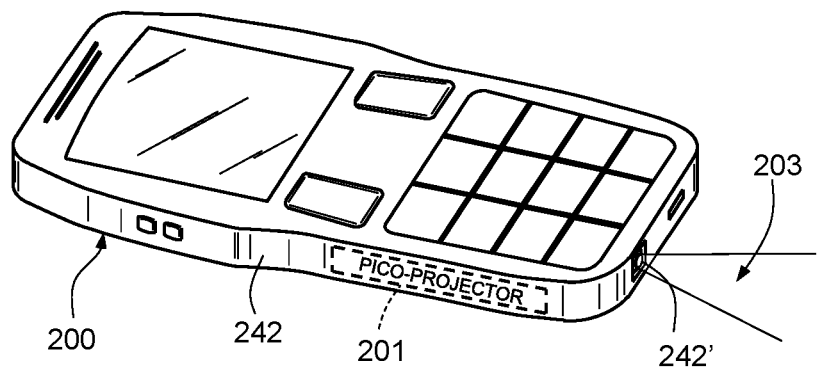

Alternatively, as illustrated in FIG. 23, the picoprojector 201 may be integrated within the portable electronic apparatus 200 and be arranged within the case 242 of the portable electronic apparatus 200. In this case, the portable electronic apparatus 200 has a respective portion 242' transparent to the light beam 203 from the micromirror device 130. The picoprojector 201 is in this case, for example, coupled to a printed-circuit board inside the case 242 of the portable electronic apparatus 200.

Finally, it is clear that modifications and variations may be made to the device and to the process described and illustrated herein, without thereby departing from the scope of the present invention, as defined in the attached claims.

Figure 24:
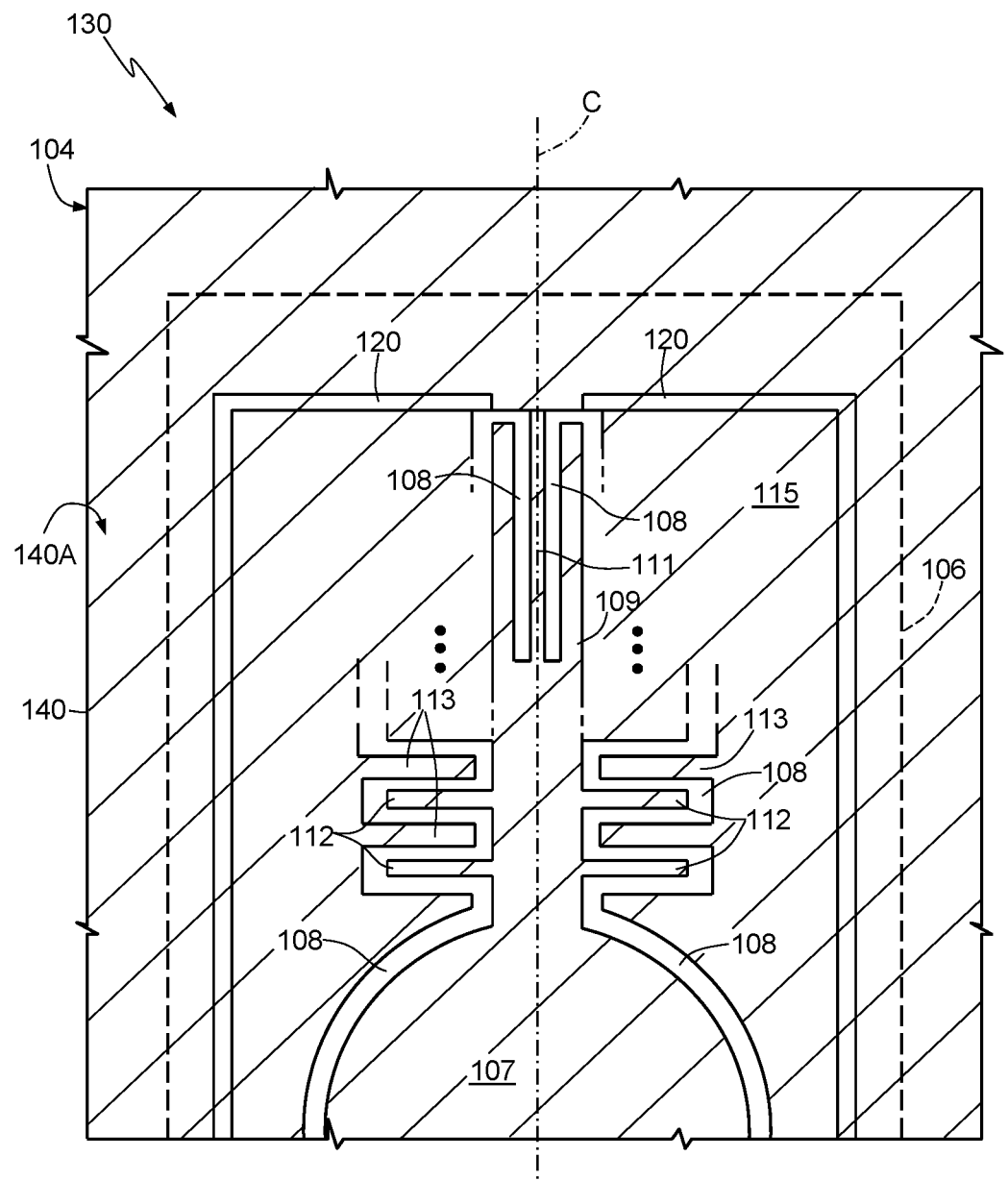
FIG. 24 is a top plan view of a different embodiment of the micromirror device.

For instance, the shape and arrangement of the holes 118 may vary with respect to what illustrated, provided that, after the oxidation step of FIGS. 11 and 17, they give rise to an insulation region 120 that electrically separates the supporting region 122 from the frame region 115, as illustrated in FIG. 24.

Furthermore, the holes 118 may have the same shape and position as the holes illustrated in FIGS. 9B and 9C of United States Patent Application Publication No. 2008/0224242 (incorporated by reference).

The invention claimed is:

1. A process for manufacturing a micromirror device in MEMS technology, comprising the steps of:
    forming a buried cavity in a monolithic body of semiconductor material having a first and a second main surfaces, the buried cavity delimiting a suspended membrane arranged between the buried cavity and the first main surface;
    forming an opening in the monolithic body from the second main surface, the opening extending as far as and joining to the buried cavity;

defining the suspended membrane to form a supporting frame and a mobile mass carried by the supporting frame and rotatable about an axis parallel to the first main surface, wherein the mobile mass has a width less than a width of the opening; and forming a reflecting region on top of the mobile mass.

2. The process according to claim 1, wherein forming the buried cavity comprises:

forming within a substrate of monocrystalline semiconductor material a plurality of trenches extending from a face of the substrate and delimiting between them columns of semiconductor material;

epitaxially growing, from the columns, a closing layer of semiconductor material, the closing layer closing the trenches at the top; and thermal annealing and causing migration of the semiconductor material of the columns towards the closing layer to form the monolithic body, the buried cavity and the suspended membrane.

3. The process according to claim 1, further comprising the step of:

forming an electrical insulating region extending peripherally around the suspended membrane, along a line electrically separating the supporting frame from a fixed supporting region, from the first main surface of the monolithic body to the buried cavity.

4. The process according to claim 3, wherein forming the electrical insulating region comprises:

forming a plurality of holes in the suspended membrane, the holes extending from the first main surface to the buried cavity and spaced from each other by suspension bridges; and completely thermally oxidizing the suspension bridges.

5. The process according to claim 4, wherein completely thermally oxidizing comprises growing oxide portions in the plurality of holes.

6. The process according to claim 5, wherein the oxide portions do not completely fill the plurality of holes.

7. The process according to claim 4, wherein the steps of forming the plurality of holes and defining the suspended membrane comprise: selectively removing portions of the suspended membrane and simultaneously forming the plurality of holes and a trench surrounding the mobile mass.

8. The process according to claim 7, wherein the trench delimits and separates mobile electrodes that are rigid with the mobile mass and fixed electrodes that are rigid with the supporting frame; the mobile and fixed electrodes being comb-fingered.

9. The process according to claim 7, wherein completely thermally oxidizing comprises forming an oxide layer on walls of the trench and of the buried cavity, wherein the oxide layer does not fill the trench.

10. The process according to claim 9, further comprising deep etching the semiconductor material of the monolithic body from the second main surface, and stopping etching at the oxide layer on the wall of the buried cavity.

11. The process according to claim 9, wherein forming the plurality of holes and completely thermally oxidizing are carried out before defining the suspended membrane.

12. The process according to claim 11, wherein, after completely thermally oxidizing and before defining the suspended membrane, the semiconductor material of the monolithic body is selectively removed underneath the buried cavity by deep etching, from the second main surface of the monolithic body, where the oxide layer on the wall of the buried cavity forms an etch-stop layer.

13. A process, comprising:

forming a buried cavity in a monolithic body of semiconductor material having a first main surface and a second main surface, the buried cavity delimiting a suspended membrane arranged between the buried cavity and the first main surface;

forming an electrical insulating region extending completely through said suspended membrane and peripherally surrounding a supporting frame;

defining in said suspended membrane a rotatable mobile mass carried by the supporting frame;

removing a portion of the monolithic body of semiconductor material from the second main surface to reach the buried cavity to thereby form an opening having a width greater than a width of the rotatable mobile mass; and forming a reflecting region on a top surface of the rotatable mobile mass.

14. The process according to claim 13, wherein forming the buried cavity comprises:

forming within a substrate of monocrystalline semiconductor material a plurality of trenches extending from a face of the substrate and delimiting between them columns of semiconductor material;

epitaxially growing, from the columns, a closing layer of semiconductor material, the closing layer closing the trenches at the face of the substrate; and thermal annealing and causing migration of the semiconductor material of the columns towards the closing layer to form the monolithic body, the buried cavity and the suspended membrane.

15. The process according to claim 13, wherein forming the electrical insulating region comprises:

forming a plurality of holes extending completely through the suspended membrane from the first main surface to the buried cavity and spaced from each other by suspension bridges; and completely thermally oxidizing the suspension bridges.

16. The process according to claim 15, wherein completely thermally oxidizing comprises growing oxide portions in the plurality of holes.

17. The process according to claim 16, wherein the oxide portions do not completely fill the plurality of holes.

18. The process according to claim 15, wherein defining the rotatable mobile mass comprises forming a trench, said trench further delimiting and separating mobile electrodes that are rigid with the rotatable mobile mass and fixed electrodes that are rigid with the supporting frame, wherein the mobile and fixed electrodes are interdigitate.

19. The process according to claim 18, wherein completely thermally oxidizing comprises forming an oxide layer on walls of the trench and of the buried cavity, but wherein said oxide layer does not fill the trench.

20. A process for manufacturing a MEMS device, comprising the steps of:

forming a buried cavity in a monolithic body of semiconductor material having a first and a second main surfaces, the buried cavity delimiting a suspended membrane arranged between the buried cavity and the first main surface;

forming an opening in the monolithic body from the second main surface, the opening extending as far as and joining to the buried cavity;

forming an electrical insulating region extending peripherally around the suspended membrane;

forming a plurality of holes in the suspended membrane, the holes extending from the first main surface to the buried cavity and spaced from each other by suspension bridges to thereby form a mobile mass that is rotatable about an axis parallel to the first main surface, wherein the mobile mass has a width less than a width of the opening; and completely thermally oxidizing the suspension bridges.

21. The process according to claim 20, wherein the suspended membrane includes a supporting frame carrying the mobile mass, the process further comprising forming a reflecting region on top of the mobile mass.

22. The process according to claim 21, wherein the electrical insulating region extends peripherally around the suspended membrane, along a line electrically separating the supporting frame from a fixed supporting region, from the first main surface of the monolithic body to the buried cavity.

23. The process according to claim 20, wherein forming the buried cavity comprises:

forming within a substrate of monocrystalline semiconductor material a plurality of trenches extending from a face of the substrate and delimiting between them columns of semiconductor material;

epitaxially growing, from the columns, a closing layer of semiconductor material, the closing layer closing the trenches at tops thereof; and thermal annealing and causing migration of the semiconductor material of the columns towards the closing layer to form the monolithic body, the buried cavity and the suspended membrane.

24. The process according to claim 20, wherein completely thermally oxidizing comprises growing oxide portions in the plurality of holes.

25. The process according to claim 24, wherein the oxide portions do not completely fill the plurality of holes.

26. The process according to claim 20, wherein forming the plurality of holes and completely thermally oxidizing are carried out before delimiting the suspended membrane.

27. The process according to claim 26, further comprising, after completely thermally oxidizing and before delimiting the suspended membrane, selectively removing semiconductor material of the monolithic body underneath the buried cavity by deep etching, from the second surface of the monolithic body.

* * * * *